US012769343B2

(12) United States Patent
Yang

(10) Patent No.: US 12,769,343 B2
(45) Date of Patent: *Oct. 20, 2026

(54) MODULAR MULTI-TUBE PRESSURE REGULATOR FOR SEMICONDUCTOR MANUFACTURING MACHINES

(71) Applicant: GENES TECH CO., LTD., Zhubei City (TW)

(72) Inventor: Ming-Hsiang Yang, Zhubei City (TW)

(73) Assignee: GENES TECH CO., LTD., Zhubei City (TW)

( * ) Notice: Subject to any disclaimer, the term of this patent is extended or adjusted under 35 U.S.C. 154(b) by 14 days.

This patent is subject to a terminal disclaimer.

(21) Appl. No.: 18/929,652

(22) Filed: Oct. 29, 2024

(65) Prior Publication Data

US 2026/0064140 A1 Mar. 5, 2026

(30) Foreign Application Priority Data

Aug. 30, 2024 (TW) ................................ 113132982

(51) Int. Cl.
*H10P 72/00* (2026.01)
*G05D 16/20* (2006.01)

(52) U.S. Cl.
CPC ..... *G05D 16/2073* (2013.01); *H10P 72/0404* (2026.01); *H10P 72/06* (2026.01)

(58) Field of Classification Search
CPC ....... G05D 16/20–208; G05D 16/2073; G05D 16/2013; G05D 16/2066; G05D 16/208; H01L 21/67023; H01L 21/67017; H01L 21/6715; H01L 21/67155; H01L 21/67161; H01L 21/67184; H01L 21/6719;

(Continued)

(56) References Cited

U.S. PATENT DOCUMENTS 3,844,683 A * 10/1974 Albert ....................... B64F 1/28 417/6
4,511,311 A * 4/1985 Olson ..................... F04B 49/04 417/5

(Continued)

FOREIGN PATENT DOCUMENTS

CN 119517805 A * 2/2025 ........ H01J 37/32449
JP 2016134585 A * 7/2016 ....... H01L 21/67017
TW I826581 12/2023

*Primary Examiner* — Craig J Price
(74) *Attorney, Agent, or Firm* — Fei-Hung Yang

(57) ABSTRACT

A modular multi-pipe pressure regulator includes 2~10 pump drive connectors, 2~10 switches, 2~10 pressure detectors, 2~10 rotation speed regulators, 2~10 alarms and a controller. Each pressure detector is installed in a pipeline of a semiconductor manufacturing machine for detecting the pipeline to feed back a pressure value. The controller has an intelligent computing model. When receiving external power drive signal, the controller independently controls each switch and lets the pump drive connectors and the rotation speed regulators drive and operate the suction pump and monitor its suction pump to obtain multiple time point rotational speeds after the switch is turned on. The controller detects each pressure value according to a set value and drives the rotation speed regulator to regulate the rotation speed of the suction pump, in order to maintain the pressure value of the pipeline within a tolerance range of the set value.

7 Claims, 3 Drawing Sheets

(58) Field of Classification Search
CPC ......... H01L 21/67253; H01L 21/67276; F04B 49/08; F04B 49/20; F04B 49/0651; F04B 2205/05; F04B 2207/042; F04B 2207/043; F04B 2207/70; H10P 72/0404; H10P 72/06–0618
USPC .......... 137/565.11, 565.16, 563; 417/2, 5, 6, 417/216, 286
See application file for complete search history.

(56) References Cited

U.S. PATENT DOCUMENTS

| | | | | |
|---|---|---|---|---|
| 4,821,761 | A * | 4/1989 | Aid | A61M 1/1668 73/239 |
| 4,945,942 | A * | 8/1990 | Lund | F24D 19/1012 122/13.3 |
| 5,746,581 | A * | 5/1998 | Okumura | F04D 27/0261 417/42 |
| 6,260,004 | B1 * | 7/2001 | Hays | F04D 15/0088 702/183 |
| 6,434,512 | B1 * | 8/2002 | Discenzo | F16C 41/008 702/184 |
| 6,847,854 | B2 * | 1/2005 | Discenzo | G05B 13/024 700/36 |
| 7,797,062 | B2 * | 9/2010 | Discenzo | G06Q 10/04 700/20 |
| 7,857,976 | B2 * | 12/2010 | Bissler | A61M 1/3639 417/53 |
| 8,417,360 | B2 * | 4/2013 | Sustaeta | H04L 67/125 700/28 |
| 8,914,300 | B2 * | 12/2014 | Sustaeta | G05B 13/024 700/99 |
| 8,951,019 | B2 * | 2/2015 | Hains | F02C 7/236 137/565.33 |
| 9,556,874 | B2 * | 1/2017 | Kidd | F04D 15/0209 |
| 9,729,639 | B2 * | 8/2017 | Sustaeta | H04L 67/125 |
| 9,804,588 | B2 * | 10/2017 | Blevins | G05B 19/4184 |
| 10,037,303 | B2 * | 7/2018 | Nixon | G06F 15/17331 |
| 10,168,691 | B2 * | 1/2019 | Zornio | G05B 19/0421 |
| 10,296,668 | B2 * | 5/2019 | Nixon | G06F 30/20 |
| 10,386,827 | B2 * | 8/2019 | Enver | G06F 11/3006 |
| 10,606,288 | B2 * | 3/2020 | Vyers | G05B 19/41885 |
| 10,649,424 | B2 * | 5/2020 | Nixon | G05B 17/02 |
| 10,656,627 | B2 * | 5/2020 | Nixon | G05B 23/0264 |
| 11,149,533 | B1 * | 10/2021 | Yeung | F04B 15/02 |
| 11,295,964 | B2 * | 4/2022 | Yang | H01L 21/67017 |
| 11,732,719 | B2 * | 8/2023 | Lechner | F04D 29/4293 417/2 |
| 12,046,456 | B2 * | 7/2024 | Kakimoto | H01J 37/32449 |
| 2003/0213560 | A1 * | 11/2003 | Wang | H01L 21/67196 156/345.31 |
| 2006/0285091 | A1 * | 12/2006 | Parekh | G03F 7/70933 355/53 |
| 2009/0204237 | A1 * | 8/2009 | Sustaeta | G06Q 10/04 700/106 |
| 2009/0204267 | A1 * | 8/2009 | Sustaeta | G06Q 10/04 700/36 |
| 2009/0210081 | A1 * | 8/2009 | Sustaeta | H04L 67/125 715/702 |
| 2010/0147394 | A1 * | 6/2010 | Trnka | F24D 19/1036 137/12 |
| 2014/0008037 | A1 * | 1/2014 | Trumper | F28F 27/00 165/96 |
| 2014/0060660 | A1 * | 3/2014 | Lebkuchner | F24D 19/1051 122/13.3 |
| 2014/0311581 | A1 * | 10/2014 | Belostotskiy | H01L 21/67253 137/565.13 |
| 2015/0053285 | A1 * | 2/2015 | Nakashima | G05D 7/0664 137/565.11 |
| 2020/0369505 | A1 * | 11/2020 | Mckay | B67D 1/0036 |
| 2021/0143025 | A1 * | 5/2021 | Yang | F04B 49/08 |
| 2022/0090264 | A1 * | 3/2022 | Yahata | C23C 16/4408 |
| 2023/0176557 | A1 * | 6/2023 | Cella | G05B 13/048 700/117 |
| 2025/0296127 | A1 * | 9/2025 | Iwao | B08B 3/14 |

* cited by examiner

MODULAR MULTI-TUBE PRESSURE REGULATOR FOR SEMICONDUCTOR MANUFACTURING MACHINES

CROSS-REFERENCE TO RELATED APPLICATIONS

This non-provisional application claims priority under 35 U.S.C. § 119(a) on Patent Application No(s). 113132982 filed in Taiwan, R.O.C. on Aug. 30, 2024, the entire contents of which are hereby incorporated by reference.

BACKGROUND OF THE INVENTION

1. Field of the Invention

The present disclosure relates to a pressure regulator of a semiconductor manufacturing machine, and more particularly relates to a modular multi-pipe pressure regulator for semiconductor manufacturing machine.

2. Description of the Related Art

In the semiconductor manufacturing process, it is necessary to accurately control each process parameter such as the temperature of the semiconductor machine or the temperature of the chemical agent, in order to ensure the yield of semiconductor devices. It is common to use the means of introducing a liquid at a specific temperature to flow through the semiconductor machine or the chemical agent tank, in order to maintain the stability of the temperature of the chemical agent in the semiconductor machine or the chemical agent tank. However, in actual manufacturing processes, the pipeline used for the semiconductor machine may be damaged, which will cause liquid leakage and result in liquid contamination to the semiconductor components in production and a low production yield, and the lack of appropriate monitoring measures in the pipeline makes it impossible for manufacturers to systematically and quickly identify the damage, thus lowering the production efficiency.

In view of these problems, the discloser of the present disclosure provides a pressure regulator installed and connected between a semiconductor manufacturing machine and a liquid supply source as disclosed in R.O.C. Patent No. I826581. This patented pressure regulator includes a suction pump, a pressure detector, a storage unit and a control unit, and the application of one semiconductor manufacturing machine corresponding to one liquid supply source is used to suck the pipeline through the suction pump, so as to reduce the pressure in the pipeline and achieve the effect of enhancing the production yield. Although the pressure regulator utilizes the suction pump to reduce the pressure in the pipeline in the operation area of the semiconductor machine to avoid the problem of liquid leakage which is caused by the damaged pipeline, the liquid supply source and the pressure regulator can be spatially separated from the semiconductor manufacturing machine and the specifications and restrictive conditions of the process site, etc. can be taken into account, yet a single pressure regulator can only provide a single suction pump and can only regulate the pressure of a single pipeline. As a result, there are obvious drawbacks in the use of the pressure regulator, and it is not easy to reduce the size, and cannot timely adjust the quantity of manufacturing machines as required in the manufacturing site. Further, in the semiconductor manufacturing process, each semiconductor manufacturing machine requires a different quantity of the liquid supply sources, which results in a different quantity of pressure regulators, and this one-to-one design structure will cause the pressure regulator to be different from the actual machine. This one-to-one design structure will cause that the configuration of the pressure regulator does not match with the actual equipment configuration and operation requirements, leading to the issues of inconvenience and cumbersome process, and it is not conducive to the enhancement of operational efficiency.

In view of the description above, how to further improve the device structure based on the technical means and achievement efficacy in the aforementioned disclosure, so that the pressure regulator can be assembled, switched, and controlled by a multiple of suction pumps at one time through the innovative hardware modularization, instead of a suction pump corresponding to a regulator and then corresponding to a semiconductor manufacturing machine, in order to improve the related art by reducing the overall size of the regulator, which is the subject intended for the present disclosure to explore.

SUMMARY OF THE DISCLOSURE

It is a primary objective of the present disclosure to overcome the problems of the related art by providing a pressure regulator assembled to suction pumps and connected to pipelines and liquid supply devices of a semiconductor manufacturing machine, in which a plurality of pump drive connectors, a plurality of switches, a controller, and other hardware devices are modularized to reduce the size of the pressure regulator and allow manufacturers and equipment managers to adaptively use the pump drive connectors to connect one or more suction pumps according the machine configuration requirements at the manufacturing site.

To achieve the aforementioned objective, the present disclosure discloses a modular multi-pipe pressure regulator for semiconductor manufacturing machine, used for regulating the pressure in pipelines of at least one semiconductor manufacturing machine coupled to liquid supply devices, including:

2~10 pump drive connectors provided for coupling external suction pumps, respectively, each external suction pump being coupled to a corresponding one of the liquid supply devices and using a corresponding one of the pipelines to couple the semiconductor manufacturing machine, such that the corresponding one of the liquid supply devices, the modular multi-pipe pressure regulator, and the semiconductor manufacturing machine are coupled to each other through the corresponding one of the pipelines to form an integral closed pipeline loop for circulating a liquid;

2~10 switches, configured to correspond to the pump drive connectors on a one-to-one correspondence;

2~10 pressure detectors, configured to correspond to the pump drive connectors on a one-to-one correspondence and installed in the corresponding one of the pipelines of the corresponding semiconductor manufacturing machine, for detecting the pressure in the corresponding one of the pipelines and feeding back a pressure value;

2~10 rotation speed regulators, configured to correspond to the pump drive connectors on a one-to-one correspondence, for modulating a rotation speed of the corresponding suction pump;

a controller, having an intelligent computing model and being extended with a plurality of power supply branches and a plurality of signal control lines, the power supply branches and the signal control lines being electrically coupled to the pump drive connectors and the rotation speed regulators; the switches being interconnected between the controller and each of the pump drive connectors, and the controller being telecommunicatively coupled to the pressure detectors, such that when the controller receives an external power drive signal, the controller independently controls the ON or OFF of each of the switches, and after the switch is turned on, the controller independently controls the corresponding pump drive connector and rotation speed regulator, and the pump drive connector drives the corresponding suction pump to work and monitor its rotation speed to obtain a plurality of time point rotational speeds; at the same time, the controller receives each the pressure value fed back by the corresponding pressure detector, detects each of the pressure values according to a set value and drives the rotation speed regulator to regulate the rotation speed of the suction pump, so as to maintain the pressure value of the corresponding one of the pipelines within a tolerance range of the set value; and 2~10 alarms, configured to correspond to the pump drive connectors on a one-to-one correspondence, and electrically coupled to the controller by the power supply branches and the signal control lines, the controller detecting the pressure values to obtain an abnormal change of one of the pressure values of the pipelines during a period, and outputting a warning signal by the corresponding alarm, and after outputting each of the warning signals, the controller waiting for and confirming a corresponding device operation after the modular multi-pipe pressure regulator releases the warning signal; in addition, the controller using the corresponding device operation and the subsequently received new corresponding time point rotational speeds and pressure values to verify the accuracy of the warning signal of the previous time point, so as to learn and modify the intelligent computing model.

Wherein, when the controller receives the external power drive signal to receive an adaptive pressure setting of the corresponding one of the pipelines, the controller sets the corresponding rotation speed regulator according to the set value of the adaptive pressure setting, and the controller detects each of the feedback pressure values to make the rotation speed regulator regulate the rotation speed of the suction pump accordingly, such that the pressure value of the corresponding one of the pipelines is maintained within a tolerance range of the set value; when the controller detects an abnormal change of the pressure values of one of the pipelines during a period, the controller stops the operation of the corresponding rotation speed regulator and does not modify the pressure in the pipelines.

Wherein, the controller includes a storage unit, and the controller uses the storage unit according to a timestamp manner to sequentially record the time point rotational speeds of the suction pump and synchronously record the set value, each of the feedback pressure values, the warning signal and the corresponding device operation correspondingly. The modular multi-pipe pressure regulator includes a display device electrically coupled to the controller for displaying the warning signal.

In addition, the controller is telecommunicatively coupled to an external control host, for controlling the controller and reading the storage unit through the control host; the controller periodically compiles and analyzes each of the set values at a cycle time point, the time point rotational speeds, the pressure values, each of the warning signals and each the corresponding device operations to form a forecasting work trend report to be sent to the control host. The controller uses a linear regression data analysis technique to analyze the time point rotational speeds and the pressure values in the storage unit to output an aging notice through at least one of the display device and the control host when it is learned that the suction pressure of the suction pump has a gradual decline or rise in trend, which might lead to aging of the parts. The controller or the control host continuously uses at least one of the new time point rotational speeds, the pressure values, the warning signals and the corresponding device operations recorded by the storage unit after the cycle time point to verify the prediction accuracy of the forecasting work trend report, so as to learn and modify the intelligent computing model, and improve the prediction accuracy of the forecasting work trend report.

In summation of the description above, the present disclosure further improves the pressure regulator as disclosed in R.O.C. Patent No. I826581 filed by the discloser of the present disclosure, in which instead of the original individual design consisting of a single suction pump and its corresponding single supporting pressure detection component, this patented technology further utilizes the concept of hardware modularization to convert the pressure regulator into a configuration with a movable external suction pump. At the same time, this pressure regulator is expanded to have 2 to 10 suction pump installation connector modules, so that manufacturers or equipment managers can freely install and configure 2 to 10 suction pumps and independently switch to control them. The technical characteristics of the present disclosure further include:

1. The 2~10 independent suction pump installation connector modules refer to the modular device with the hardware components of 2~10 pump drive connectors, 2~10 switches, 2~10 pressure detectors, 2~10 rotation speed regulators, 2~10 alarms and the controller. With these 2 to 10 independent connector modules, under the premise of limited space on the process equipment, the size and number of configurations of the previously disclosed pressure regulator can be effectively reduced, thereby saving space and reducing equipment costs. In addition, the pressure regulator required for each semiconductor manufacturing machine in the actual process site is variable, so that through the free allocation and use of the 2 to 10 independent connector modules in the modular multi-pipe pressure regulator, the system allows manufacturers or equipment managers to flexibly configure the required quantity according to the actual process requirements, and the installation is simple and convenient for equipment managers to carry out the configuration.

2. The 2~10 pump drive connectors are respectively configured with 2~10 switches, 2~10 pressure detectors, 2~10 rotation speed regulators and 2~10 alarms and independently controlled by the controller. The controller drives the rotation speed regulator to regulate and adjust the rotation speed of the suction pump according to the set value and each of the pressure values. This enables the present disclosure to have the ability of 2 to 10 suction pumps to independently and automatically adjust the pipeline pressure to achieve the function of automatic error correction, so as to avoid the problem of forced alarm caused by aging of the process equipment, resulting in reduction or loss of production capacity and manufacturing process.

3. The controller includes an intelligent computing module and uses artificial intelligence (AI) to intelligently and automatically collect each type of data, such as the time point rotational speeds, the pressure values, each of the warning signals and each of the corresponding device operations, etc., during the operation of the device and use these data to automatically learn and expand the database to gradually improve the judgment accuracy of abnormality. This arrangement not only saves the time of equipment managers, but also waives the judgments made by personnel and required for inexperienced productions every time when abnormality occurs, as well as preventing the equipment managers to make wrong judgment which will lead to process stagnation or loss, etc.

DETAILED DESCRIPTION OF THE PREFERRED EMBODIMENTS

Figure 1:
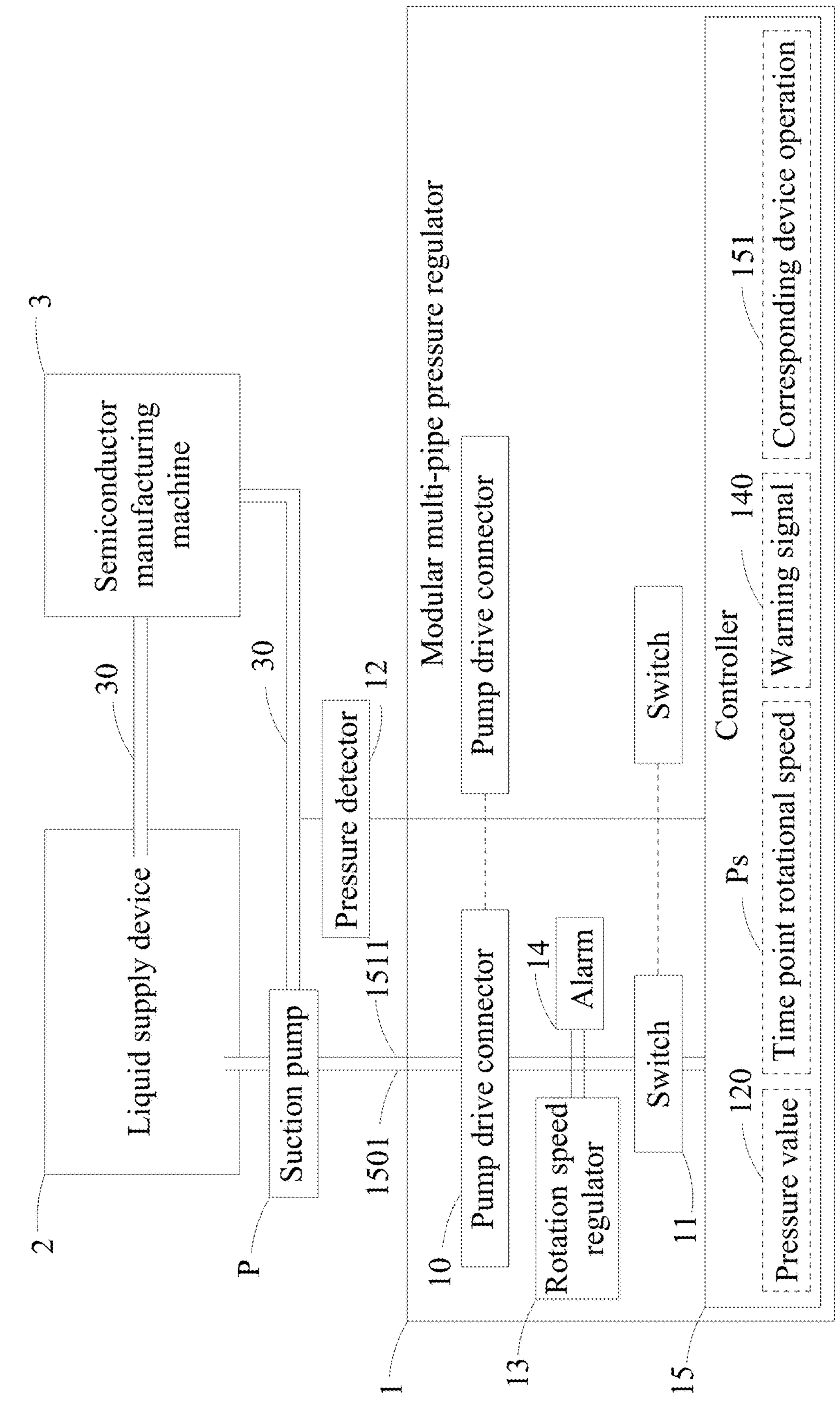
FIG. 1 is a schematic block diagram showing the structure of a first preferred embodiment of the present disclosure.

With reference to FIG. 1 for the schematic block diagram showing the structure of the first preferred embodiment of the present disclosure, the modular multi-pipe pressure regulator 1 for semiconductor manufacturing machine 3 includes a pump drive connector 10, a switch 11, a pressure detector 12, a rotation speed regulator 13, an alarm 14 and a controller 15, and the modular multi-pipe pressure regulator is used for regulating the pressure in a pipeline 30 of at least one semiconductor manufacturing machine 3 connected to a liquid supply device 2. The pump drive connector 10 is connected to an external suction pump P, and the external suction pump P is connected to the liquid supply device 2, and the pipeline 30 is connected to the semiconductor manufacturing machine 3, so that the liquid supply device 2, the modular multi-pipe pressure regulator 1, and the semiconductor manufacturing machine 3 form an integral closed pipeline loop for circulating liquid through the pipeline 30.

The switch 11, the pressure detector 12, the rotation speed regulator 13 and the alarm 14 are configured corresponding to the pump drive connector 10, and the controller 15 is extended with a plurality of power supply branches 1501 and a plurality of signal control lines 1511. The power supply branches 1501 and the signal control lines 1511 are electrically connected to the pump drive connector 10, the rotation speed regulator 13 and the alarm 14, the switch 11 is connected between the controller 15 and the pump drive connector 10, and the rotation speed regulator 13 is provided for regulating the rotation speed of the external suction pump P. The pressure detector 12 is installed in the pipeline 30 of the semiconductor manufacturing machine 3 and telecommunicatively connected to the controller 15 for detecting the pressure in the pipeline 30 and timely feeding back a pressure value 120 to the controller 15.

The controller 15 includes an intelligent computing model, the controller 15 monitors the rotation speed of the external suction pump P through the pump drive connector 10 and receives each of the pressure values 120. When the controller 15 receives the drive signal of an external power supply (not shown in the figure), the controller independently controls the ON or OFF of the switch 11, in order to independently control the pump drive connector 10, rotation speed regulator 13, and alarm 14 after the switch 11 is turned on, and to drive the external suction pump P to operate through the pump drive connector 10 according to a set value and synchronously monitor the rotation speed of the external suction pump P to obtain a plurality of time point rotational speeds Ps; at the same time, the controller 15 detects each of the pressure values 120 fed back by the pressure detector 12 of the pump drive connector 10 to drive the rotation speed regulator 13 to regulate the rotation speed of the external suction pump P, so as to maintain the pressure value of the pipeline 30 within a tolerance range of the set value.

In addition, the controller 15 detects the pressure values 120 and outputs a warning signal 140 by the alarm 14 to warn the manufacturers to pay attention to the abnormality and expediate the elimination of the abnormality after knowing that there is an abnormal change of the pressure value 120 of the pipeline 30. Further, after outputting each of the warning signals 140, the controller 15 waits and confirms that the modular multi-pipe pressure regulator 1 has released a corresponding device operation 151 of the warning signal 140. The controller 15 utilizes the corresponding device operation 151 and the subsequently received new time point rotational speeds Ps and pressure values 120 to verify the accuracy of the warning signal 140 of the previous time point to learn and modify the intelligent computing model, so as to improve the accuracy and reliability for the controller 15 to automatically determine what situation is mostly likely to happen.

Figure 2:
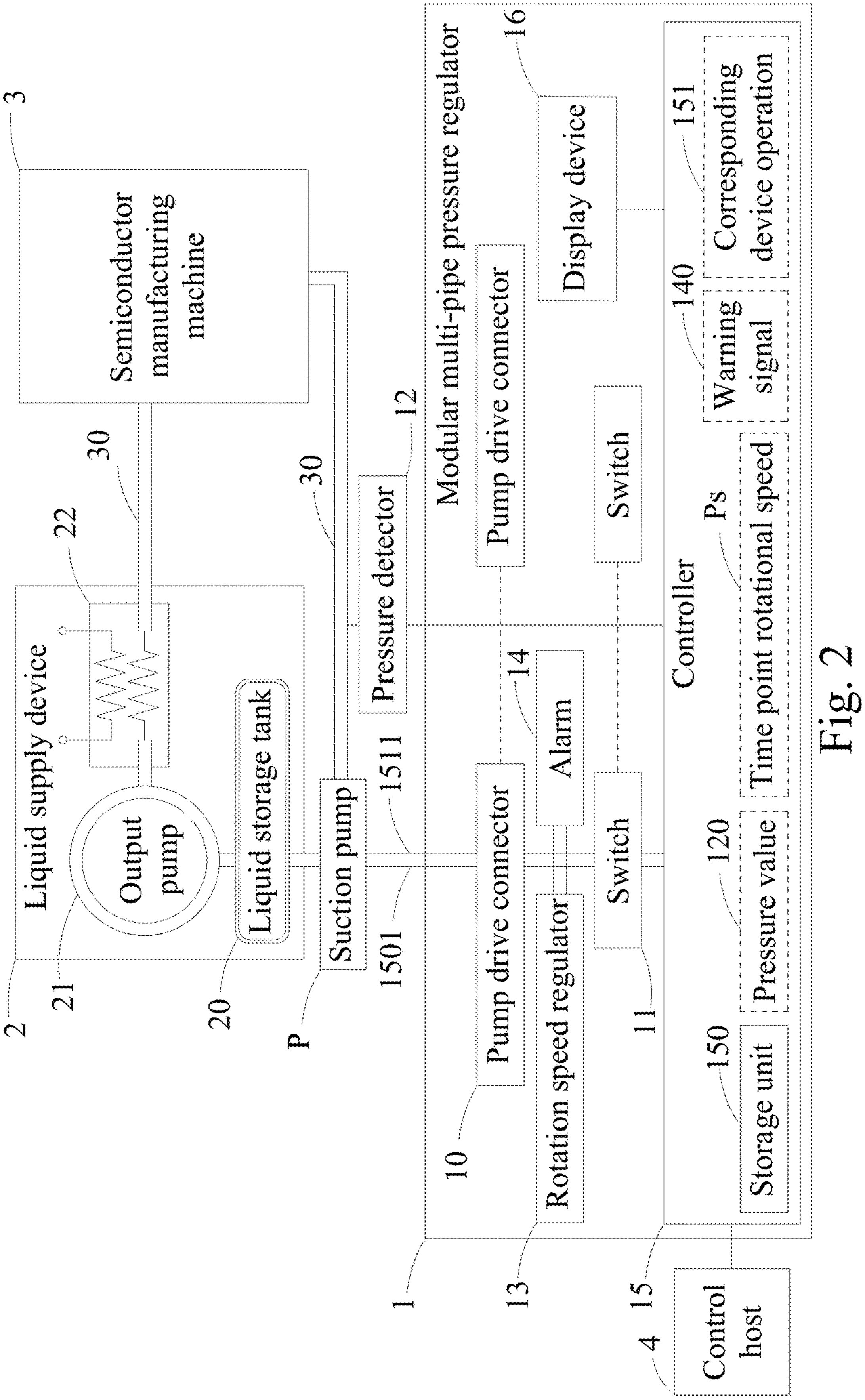
FIG. 2 is a schematic block diagram showing the structure of a second preferred embodiment of the present disclosure.

With reference to FIG. 2 for the schematic block diagram of the structure of the second preferred embodiment of the present disclosure, the modular multi-pipe pressure regulator 1 for semiconductor manufacturing machine includes a pump drive connector 10, a switch 11, a pressure detector 12, a rotation speed regulator 13, an alarm 14, a controller 15 and a display device 16. The pressure regulator 1 is provided for regulating the pressure in a pipeline 30 of at least one semiconductor manufacturing machine 3 connected to a liquid supply device 2. The liquid supply device 2 includes a liquid storage tank 20, an output pump 21 and a heat exchanger 22, an end of the heat exchanger 22 is connected to the semiconductor manufacturing machine 3 through the pipeline 30, and the end of the heat exchanger 22 is connected to an end of the output pump 21, and the other end of the output pump 21 is connected to an end of the liquid storage tank 20. The pump drive connector 10 is connected to an external suction pump P, and the external suction pumps P is connected to the other end of the liquid storage tank 20 of the liquid supply device 2 and connected to the semiconductor manufacturing machine 3 by the pipeline 30, so that the liquid supply device 2, the modular multi-pipe pressure modulator 1, and the semiconductor manufacturing machine 3 form an integral closed pipeline loop through the pipeline.

The switch 11, the pressure detector 12, the rotation speed regulator 13 and the alarm 14 are configured corresponding to the pump drive connector 10, and the controller 15 is extended with a plurality of power supply branches 1501 and a plurality of signal control lines 1511. The power supply branches 1501 and the signal control lines 1511 are electrically connected to the pump drive connector 10, the rotation speed regulator 13 and the alarm 14, respectively, the switch 11 is connected between the controller 15 and the pump drive connector 10, and the rotation speed regulator 13 is provided for regulating the rotation speed of the external suction pump P. The pressure detector 12 is installed in the pipeline 30 of the semiconductor manufacturing machine 3 and telecommunicatively connected to the controller 15 for detecting the pressure in the pipeline 30 and timely feeds back a pressure value 120 to the controller 15. It is noteworthy that the pressure detector 12 can be connected to the controller 15 through a cable or wireless method, and the controller 15 can record a corresponding device code, or unique identifier, of each of the pressure detector 12 and the pump drive connector 10 to complete the corresponding setting of the pressure detector 12 and the pump drive connector 10. The corresponding setting method is well known by a person having ordinary skill in the art and is not limited to any particular method.

The controller 15 is telecommunicatively connected to the display device 16, and the controller 15 includes an intelligent computing model and a storage unit 150. The controller 15 monitors the rotation speed of the external suction pump P through the pump drive connector 10 and receives each of the pressure values 120. When the controller 15 receives the drive signal of an external power supply (not shown in the figure), the controller 15 independently controls the ON or OFF of the switch 11, so that after the switch 11 is turned on, the controller independently controls the pump drive connector 10, rotation speed regulator 13, and alarm 14, and uses the pump drive connector 10 to drive the external suction pump P to operate and synchronously monitor the rotation speed of the external suction pump P to obtain a plurality of time point rotational speeds Ps; at the same time, the controller 15 receives an adaptive pressure setting of the pipeline 30 to set a set value of the rotation speed regulator 13 according to the adaptive pressure setting.

Further, the controller 15 detects each of the pressure values 120 fed back by the pressure detector 12 of the pump drive connector 10, such that the rotation speed regulator 13 regulates the rotation speed of the external suction pump P according to the set value to maintain the pressure value of the pipeline 30 within a tolerance range of the set value. When the controller 15 detects an abnormal change of the pressure values 120 of the pipeline 30 during a period, a warning signal 140 outputted by the alarm 14 is used, and the display device 16 may also synchronously display the warning signal 140 to warn the manufacturer to pay attention to the abnormality and accelerate the elimination of the abnormality. After the controller 15 outputs each of the warning signals 140, the controller 15 waits and confirms that the modular multi-pipe pressure regulator 1 has released a corresponding device operation 151 of the warning signal 140. At this time, when the controller 15 detects the abnormal change of the pressure values 120 of the pipeline 30 during a period of time, the controller 15 stops the operation of the rotation speed regulator 13 and modify the pressure in the pipeline 30 without following the set value. Accordingly, the controller 15 can independently control the operation status of the external suction pump P through the pump drive connector 10 to achieve the effect of regulating the pressure in pipeline 30.

Figure 3:
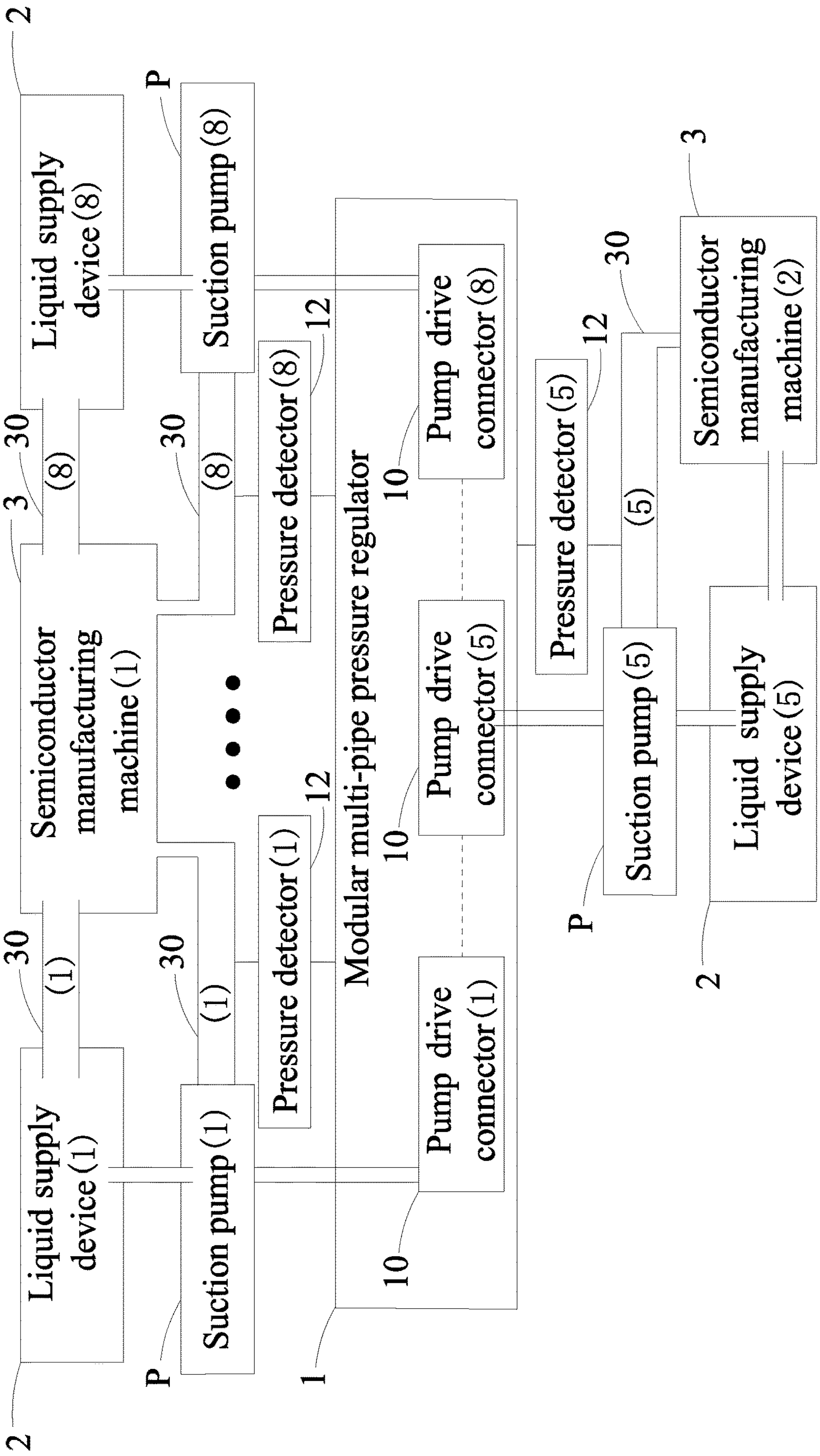
FIG. 3 is a schematic block diagram showing an application of a third preferred embodiment of the present disclosure.

Further, the controller 15 utilizes the corresponding device operation 151 and subsequently received new time point rotational speeds Ps and pressure values 120 to verify the accuracy of the warning signal 140 of the previous time point, so as to learn and modify the intelligent computing model, in hope of allowing the controller 15 to correctly and automatically determine the most likely situation based on changes in pressure without human intervention. It is noteworthy that in another embodiment, the pump drive connectors 10 assembled with external suction pumps P can be installed to a same or different semiconductor manufacturing machine 3 as shown in FIG. 3, and the modular multi-pipe pressure regulator 1 can have 2~10 (here shows 8) pump drive connectors 10. At this time, the switches 11, the pressure detectors 12, the rotation speed regulators 13 and the alarms 14 are also configured to be 2~10 (here also shows 8), corresponding to the quantity of pump drive connectors 10, which will not be described further here. Since the first and eighth pump drive connectors 10 can be installed to the pipelines 30 of a same semiconductor manufacturing machine 3 according to the chemical supply requirements and cooling requirements of the semiconductor manufacturing machine 3. At this time, the fifth pump drive connector 10 in the modular multi-pipe pressure regulator 1 can be assembled to another machine according to the distribution requirements of other sites, which is really helpful for manufacturers or equipment managers to freely and flexibly configure the machines according to practical needs. In practices, we only need to set up the corresponding relationship between the machine and the connector through the controller 15 in order to use the machine online. This not only improves the adaptability of the modular multi-pipe pressure regulator 1, but also improves the ease of operation and convenience for equipment managers to configure the equipment at the manufacturing site.

In this embodiment, the controller 15 utilizes the storage unit 150 to sequentially record the time point rotational speeds Ps of the external suction pumps P in a timestamp manner and synchronously record the set value and each of the feedback pressure value 120, warning signal 140 and corresponding device operation 151. In addition, the controller 15 can be telecommunicatively connected to an external control host 4 to control the operation of the control host 4 and read the storage unit 150. The controller 15 utilizes a linear regression data analysis technique to analyze the time point rotational speeds Ps and the pressure values 120 in the storage unit 150, in order to output an aging notice through at least one of the display device 16 and the control host 4 to notify the manufacturers or the back-end administrators about the aging of the suction pump and the requirements for maintenance, replacement and a more rigorous inspection strategy when it is learned that the suction pressures of the external suction pumps P has a gradual decline or rise in trend, which might lead to aging of the parts.

The controller 15 periodically compiles and analyzes each of the set values, time point rotational speeds Ps, pressure values 120, warning signals 140 and corresponding device operations 151 stored in the storage unit 150 at a cycle time point to form a forecasting work trend report and sends the forecasting work trend report to the control host 4. Then, the controller 15 or the control host 4 utilizes at least one of the recorded new time point rotational speeds Ps, pressure values 120, warning signals 140 and corresponding device operations 151 stored in the storage unit 150 at the cycle time point to verify the prediction accuracy of the forecasting work trend report, so as to learn and modify the intelligent computing model and improve the prediction accuracy of the forecasting work trend report. In this way, the controller 15 has an automatic learning function and can independently expand the database to gradually improve the accuracy of determination, reduce the misjudgment rate, and save the time of the manufacturers, equipment engineers or back-end administrators.

What is claimed is:

1. A modular multi-pipe pressure regulator for semiconductor manufacturing machine, used for regulating pressure in pipelines of at least one semiconductor manufacturing machine coupled to liquid supply devices, comprising:

2~10 pump drive connectors provided for coupling external suction pumps, respectively, each external suction pump being coupled to a corresponding one of the liquid supply devices and using a corresponding one of the pipelines to couple the at least one semiconductor manufacturing machine, such that the corresponding one of the liquid supply devices, the modular multi-pipe pressure regulator, and the at least one semiconductor manufacturing machine are coupled to each other through the corresponding one of the pipelines to form an integral closed pipeline loop for circulating a liquid;

2~10 switches corresponding to the 2~10 pump drive connectors on a one-to-one correspondence;

2~10 pressure detectors corresponding to the 2~10 pump drive connectors on a one-to-one correspondence, and installed in the corresponding one of the pipelines of the at least one semiconductor manufacturing machine, for detecting the pressure in the corresponding one of the pipelines and feeding back a pressure value;

2~10 rotation speed regulators, corresponding to the 2~10 pump drive connectors on a one-to-one correspondence, for modulating a rotation speed of a corresponding external suction pump;

a controller, having an intelligent computing model and being extended with a plurality of power supply branches and a plurality of signal control lines, the plurality of power supply branches and the plurality of signal control lines being electrically coupled to the 2~10 pump drive connectors and the 2~10 rotation speed regulators, the 2~10 switches being interconnected between the controller and each of the 2~10 pump drive connectors, and the controller being telecommunicatively coupled to the 2~10 pressure detectors, such that when the controller receives an external power drive signal, the controller independently controls an ON or OFF state of each of the 2~10 switches, and after a switch is turned on, the controller independently controls a corresponding pump drive connector and a corresponding rotation speed regulator, and the corresponding pump drive connector drives the corresponding external suction pump to work and monitor the rotation speed to obtain a plurality of time point rotational speeds, at the same time, the controller receives each pressure value fed back by a corresponding pressure detector, detects each of the pressure values according to a set value, and drives the corresponding rotation speed regulator to regulate the rotation speed of the corresponding external suction pump, so as to maintain a corresponding pressure value of the corresponding one of the pipelines within a tolerance range of the set value; and 2~10 alarms corresponding to the 2~10 pump drive connectors on a one-to-one correspondence, and electrically coupled to the controller by the plurality of power supply branches and the plurality of signal control lines, the controller detecting the pressure values to obtain an abnormal change of one of the pressure values of the pipelines during a period, and outputting a warning signal by a corresponding alarm, and after outputting the warning signal, the controller waiting for and confirming a corresponding device operation after the modular multi-pipe pressure regulator releases the warning signal, in addition, the controller using the corresponding device operation and new corresponding time point rotational speeds and pressure values, that are subsequently received, to verify an accuracy of the warning signal of a previous time point, so as to learn and modify an intelligent computing model.

2. The modular multi-pipe pressure regulator according to claim 1, wherein, when the controller receives the external power drive signal to receive a corresponding adaptive pressure setting of the corresponding one of the pipelines, the controller sets the corresponding rotation speed regulator according to the set value of the corresponding adaptive pressure setting, and the controller detects each of the pressure values to make the corresponding rotation speed regulator regulate the rotation speed of the corresponding external suction pump accordingly, such that the corresponding pressure value of the corresponding one of the pipelines is maintained within the tolerance range of the set value, and when the controller detects the abnormal change of the one of the pressure values of the pipelines during the period, the controller stops an operation of the corresponding rotation speed regulator and does not modify the pressure in the pipelines.

3. The modular multi-pipe pressure regulator according to claim 2, wherein the controller comprises a storage unit, and the controller uses the storage unit, according to a timestamp manner, to sequentially record the plurality of time point rotational speeds of the corresponding external suction pump and synchronously record the set value, each of the pressure values, the warning signal, and the corresponding device operation.

4. The modular multi-pipe pressure regulator according to claim 3, further comprises a display device electrically coupled to the controller for displaying the warning signal.

5. The modular multi-pipe pressure regulator according to claim 4, wherein the controller is telecommunicatively coupled to an external control host, for controlling the controller and reading the storage unit through the external control host, the controller periodically compiles and analyzes, at a cycle time point, each of the set value, the plurality of time point rotational speeds, the pressure values, the warning signal, and the corresponding device operation to form a forecasting work trend report to be sent to the external control host.

6. The modular multi-pipe pressure regulator according to claim 5, wherein the controller uses a linear regression data analysis technique to analyze the plurality of time point rotational speeds and the pressure values in the storage unit to output an aging notice through at least one of the display device and the control host when the controller detects that a suction pressure of the corresponding external suction pump has a gradual decline or rise in trend, which would lead to aging of parts.

7. The modular multi-pipe pressure regulator according to claim 6, wherein the controller or the external control host continuously uses at least one of the new corresponding time point rotational speeds, the pressure values, the warning signal, and the corresponding device operation, recorded by the storage unit after the cycle time point, to verify a prediction accuracy of the forecasting work trend report, so as to learn and modify the intelligent computing model and improve the prediction accuracy of the forecasting work trend report.

* * * * *